US007113405B2

(12) United States Patent
Armstrong et al.

(10) Patent No.: US 7,113,405 B2
(45) Date of Patent: Sep. 26, 2006

(54) INTEGRATED POWER MODULES WITH A COOLING PASSAGEWAY AND METHODS FOR FORMING THE SAME

(75) Inventors: John Armstrong, Apex, NC (US); Larry Lynam, Youngsville, NC (US); Winston L. Zeng, Raleigh, NC (US)

(73) Assignee: Eaton Power Quality Corporation, Cleveland, OH (US)

( * ) Notice: Subject to any disclaimer, the term of this patent is extended or adjusted under 35 U.S.C. 154(b) by 334 days.

(21) Appl. No.: 10/855,869

(22) Filed: May 27, 2004

(65) Prior Publication Data

US 2005/0265002 A1  Dec. 1, 2005

(51) Int. Cl.
*H05K 7/20* (2006.01)
(52) U.S. Cl. .............. 361/719; 361/690; 361/697; 165/80.3
(58) Field of Classification Search ........ 361/690, 361/697, 719, 720; 165/80.2–80.3; 174/15.1, 174/16.2, 16.3
See application file for complete search history.

(56) References Cited

U.S. PATENT DOCUMENTS 5,910,884 A * 6/1999 Garza et al. ............... 361/690

5,946,192 A * 8/1999 Ishigami et al. ............ 361/704
2003/0011986 A1 * 1/2003 Ariga ......................... 361/687

FOREIGN PATENT DOCUMENTS

| JP | 07131953 | * 5/1995 |
| JP | 09-294312 | * 11/1997 |

\* cited by examiner

*Primary Examiner*—Michael Datskovsky
*Assistant Examiner*—Robert J. Hoffberg
(74) *Attorney, Agent, or Firm*—Myers Bigel Sibley & Sajovec

(57) ABSTRACT

An integrated power module includes a longitudinally extending mounting member defining a cooling passageway on a first side thereof. A heat sink is positioned in the cooling passageway. A printed circuit board is positioned proximate a second side of the mounting member opposite the first side. A heat generating power circuit is electrically coupled to the printed circuit board and positioned between the printed circuit board and the mounting member. The power circuit is thermally coupled to the heat sink. An inductor is mounted in the cooling passageway. Methods of forming an integrated power module are also provided.

28 Claims, 12 Drawing Sheets

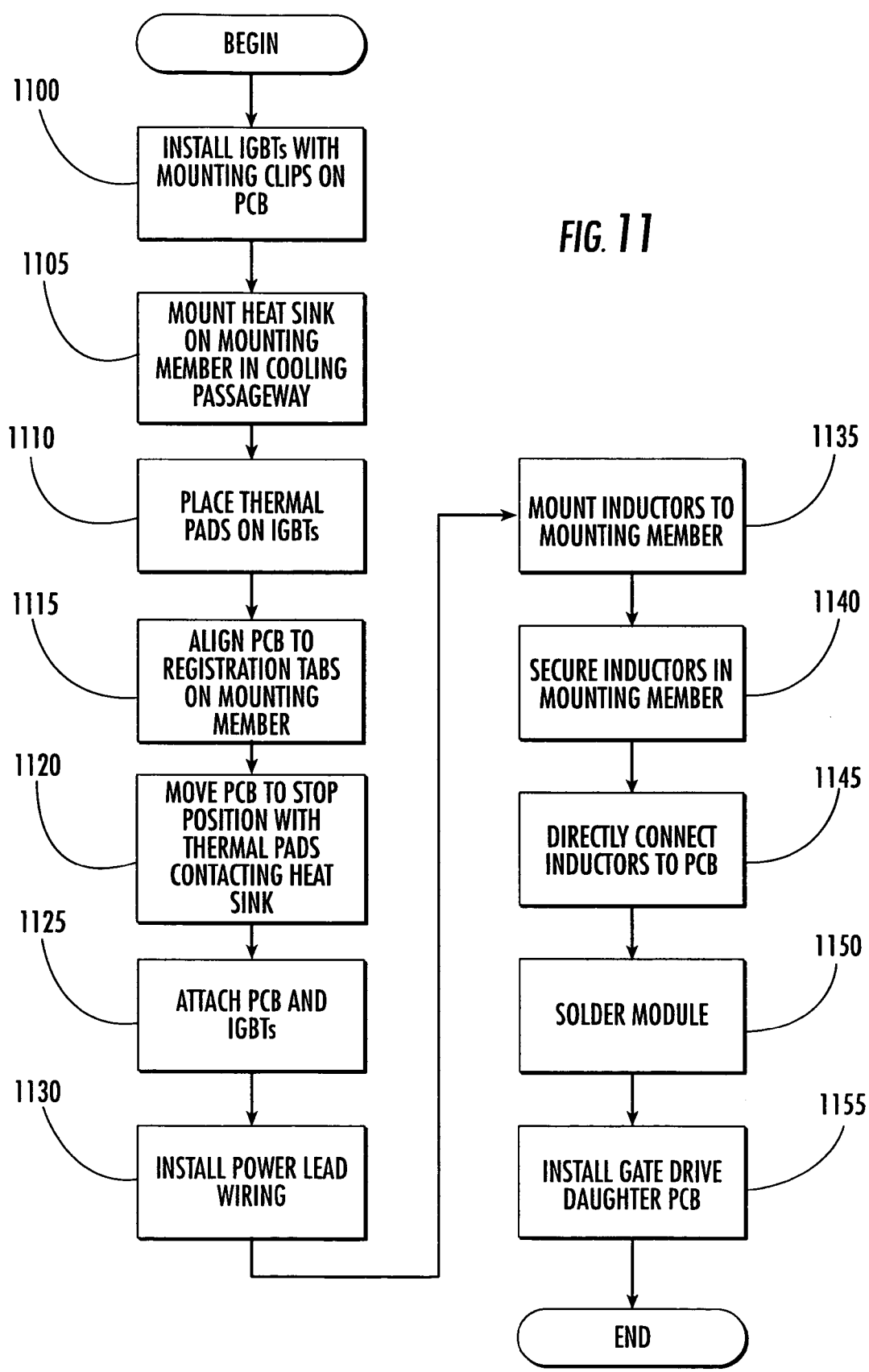

INTEGRATED POWER MODULES WITH A COOLING PASSAGEWAY AND METHODS FOR FORMING THE SAME

BACKGROUND OF THE INVENTION

The present invention relates to power modules and, more particularly, to integrated power modules and method for forming the same.

A power conversion device, such as a three phase uninterruptible power supply (UPS), may include multiple power conversion circuits. For example, an online UPS may include a rectifier that is used to rectify an input AC voltage to generate a DC voltage and an inverter that generates an AC voltage from this DC voltage. The UPS may also include additional power conversion circuits, such as battery charger and/or converter circuits.

Such power conversion circuits typically include a variety of printed circuit board (PCB) mounted components such as inductors, current sensors insulated gate bipolar transistor (IGBT) bridge circuits. Packaged multi-transistor devices have been developed for such applications. For example, "six pack" devices are offered that include three IGBT half-bridges mounted on a common heat sink and encased in a molded housing. Passive devices, such as inductors or capacitors, may be coupled to pins of such a device to form a rectifier, inverter, or other power conversion circuit.

The inductors are generally heavy devices made from coiled wire. As such, it may be difficult to mount the inductor on the PCB including the other circuit components. Typically, the separately mounted inductors are electrically coupled to the PCB with the other circuit components using a series of bus bars, wires and connectors. The inductors may be grouped and/or packaged in a mounting arrangement separate from the mounting of the PCB with the other circuit components. Such an arrangement typically results in the use of relatively large enclosures for the power conversion circuits. The enclosure must also generally provide cooling to various included heat generating elements, such as the IGBTs and the inductors, which cooling arrangement may include heat sinks, cooling fans and the like.

SUMMARY OF THE INVENTION

Embodiments of the present invention provide integrated power modules including a longitudinally extending mounting member defining a cooling passageway on a first side thereof. A heat sink is positioned in the cooling passageway. A printed circuit board is positioned proximate a second side of the mounting member opposite the first side. A heat generating power circuit is electrically coupled to the printed circuit board and positioned between the printed circuit board and the mounting member. The power circuit is thermally coupled to the heat sink. An inductor is mounted in the cooling passageway.

In other embodiments of the present invention, the heat generating power circuit is an insulated gate bipolar transistor (IGBT) module. The power module further includes a power switching circuit, including the IGBT, on the printed circuit board. The inductor is electrically connected to the power switching circuit. The power module may be, for example, a rectifier, inverter and/or battery charger. The printed circuit board may be mounted on the mounting member and the inductor may be mounted on the mounting member. A thermal pad may be positioned between the heat generating power circuit and the heat sink.

In further embodiments of the present invention, the mounting member includes an opening therein extending from the cooling passageway to the second side of the mounting member. The heat sink includes a base positioned in the opening. The mounting member may further include a heat sink locating member that locates the base of the heat sink at a desired distance from the printed circuit board. The heat generating power circuit may include a substantially planar heat sink contact surface facing the base of the heat sink. The mounting member may further include a stop member defining an offset distance of the printed circuit board from the mounting member. A registration member may be positioned to contact the printed circuit board before the printed circuit board contacts the stop member during mounting of the printed circuit board. The registration member may be configured to define a position of the heat sink contact surface relative to the base of the heat sink in a plane defined by the heat sink contact surface. The printed circuit board may be mounted to the mounting member and the mounting member may include a plurality of mounting posts extending from the second side of the mounting member.

In other embodiments of the present invention, the registration member includes a first tab having a height relative to the second side of the mounting member greater than a height of the mounting posts relative to the second side of the mounting member. The first tab is positioned on the mounting member to define a reference location along a first axis of the plane defined by the heat sink contact surface. The registration member may also include a second tab having a height relative to the second side of the mounting member greater than the height of the mounting posts. The second tab may be positioned on the mounting member to define a reference location along a second axis of the plane defined by the heat sink contact surface.

In further embodiments of the present invention, the printed circuit board includes a first alignment opening configured to receive and engage the first tab. The second alignment opening has a contact surface configured to define the reference location along the first axis of the plane defined by the heat sink contact surface. A second alignment opening may be configured to receive and engage the second tab. The second alignment opening may have a contact surface configured to define the reference location along the second axis of the plane defined by the heat sink contact surface.

In other embodiments of the present invention, the power module further includes a mounting arm connecting the heat generating power circuit to the heat sink member. The mounting arm may be a plurality of mounting clips on the heat generating power circuit.

In further embodiments of the present invention, the power module includes a plurality of inductors and a plurality of heat generating power circuits. A plurality of inductor connector cables may directly connect the inductors to the printed circuit board. A plurality of power connector cables may extend to bus bars from the printed circuit board. The power connector cables may be directly connected to the printed circuit board. The heat sink may be positioned between the inductors and the bus bars and the plurality of power cables may be bundled and extend across the heat sink. A plate may be positioned on a face of the heat sink opposite the base of the heat sink and the bundled power cables may extend across and be secured to the plate. The mounting member may include a plurality of cable openings therein extending from the cooling passageway towards the printed circuit board and the inductor connector cables may pass through the cable openings to directly connect to the printed circuit board.

In other embodiments of the present invention, the mounting member includes a plurality of slots therein extending from the cooling passageway. The inductors may include a mounting tab configured to insert in one of the slots to mount the inductors on the mounting member. The slots may be arranged in a row extending along the cooling passageway and the inductors may be mounted in a contacting stacked relationship along the row. A bracket may be coupled to the mounting member to secure the stacked inductors to limit movement thereof along the row.

In some embodiments of the present invention, power converter apparatus are provided. The power conversion apparatus have a housing that includes therein a pair of power modules as described for various embodiments above with the first sides thereof facing each other.

In further embodiments of the present invention, methods of forming an integrated power module include installing a heat sink in a cooling passageway on a first side of and defined by a mounting member. A heat generating power circuit is positioned on a printed circuit board. The heat generating power circuit has a substantially planar heat sink contact surface therein facing way from the printed circuit board. The printed circuit board is positioned with an alignment opening therein adjacent a registration member of the mounting member. The printer circuit board is moved towards the mounting member until the printed circuit board contacts a stop member, with the registration member passing into the alignment opening to guide the printer circuit board to a desired position of the heat sink contact surface relative to the heat sink in a plane defined by the heat sink contact surface.

In other embodiments of the present invention, the mounting member includes a plurality of mounting posts for mounting the printed circuit board. The registration member includes a first tab and a second tab extending from the mounting member to a height greater than the stop member. Positioning the printed circuit board with an alignment opening therein adjacent a registration member of the mounting member in such embodiments includes positioning a first alignment opening configured to receive and engage the first tab and having a contact surface configured to define a reference location along a first axis of the plane defined by the heat sink contact surface sink and a second alignment opening configured to receive and engage the second tab and having a contact surface configured to define a reference location along a second axis of the plane defined by the heat sink contact surface. An inductor may be mounted on the mounting member in the cooling passageway. The inductor may be directly connected to the printed circuit board.

BRIEF DESCRIPTION OF THE DRAWINGS

FIG. 11 is a flowchart illustrating forming an integrated power module according to some embodiments of the present invention.

DETAILED DESCRIPTION

Figure 1:
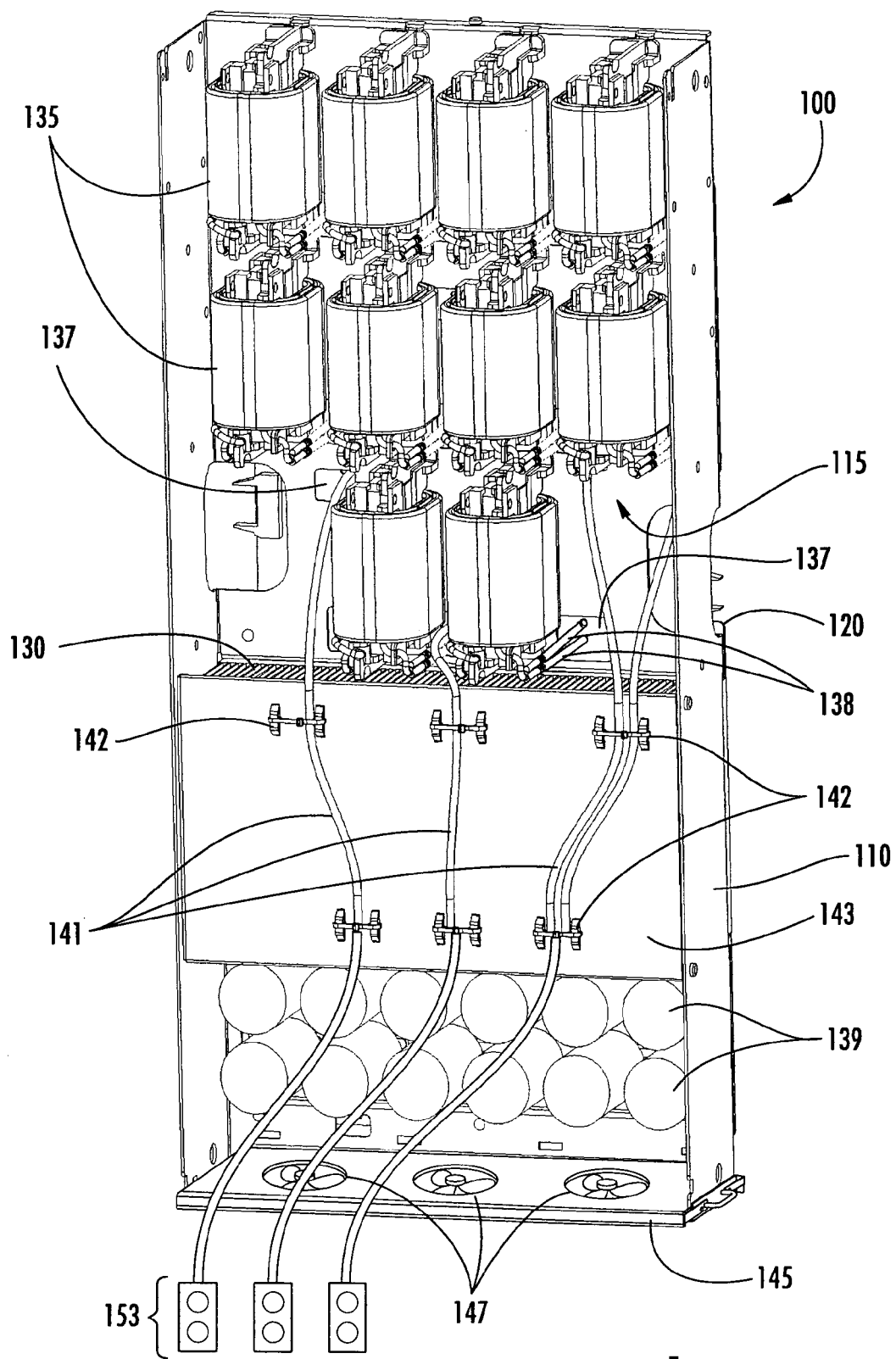
FIG. 1 is a front perspective view of an integrated power module according to some embodiments of the present invention.

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the relative sizes of regions or features may be exaggerated for clarity. It will be understood that when an element is referred to as being "connected" or "coupled" to another element, it can be directly connected or coupled to the other element or intervening elements may be present. As used herein the term "and/or" includes any and all combinations of one or more of the associated listed items. Like numbers refer to like elements throughout.

Figure 2:
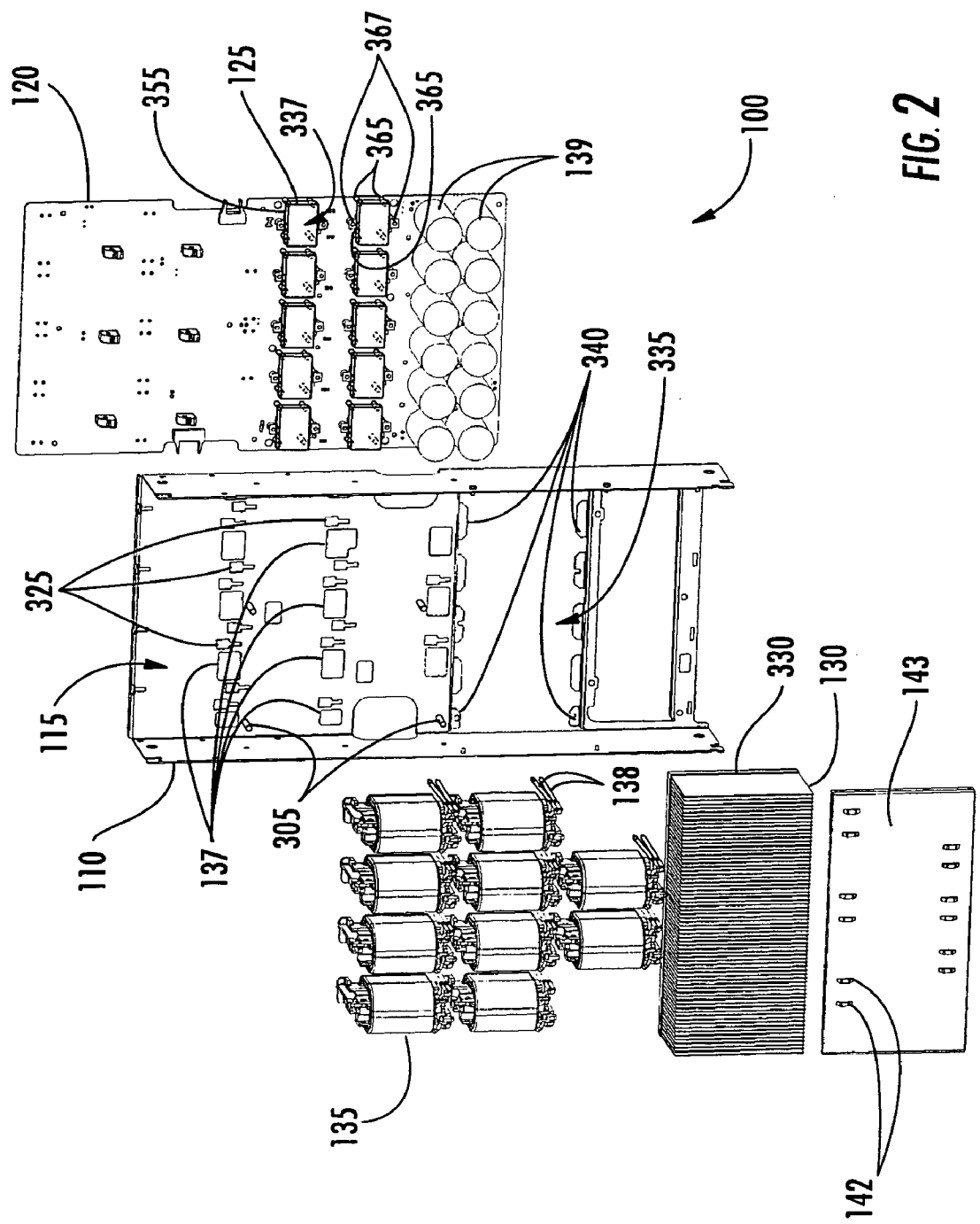
FIG. 2 is an exploded front perspective view of the integrated power module of FIG. 1.

Embodiments of the present invention will now be described with reference to the various embodiments illustrated in FIGS. 1–9. FIG. 1 is a front perspective view of an integrated power module 100 according to some embodiments of the invention. FIG. 2 is an exploded front perspective view of the module 100 of FIG. 1. As illustrated in FIGS. 1 and 2, the module 100 includes a longitudinally extending mounting member 110 that defines a cooling passageway 115 on a first or front side thereof shown in FIGS. 1 and 2. The mounting member 110 may be, for example, a sheet metal (e.g., aluminum) structure having the cooling passageway 115 defined therein.

Figure 3:
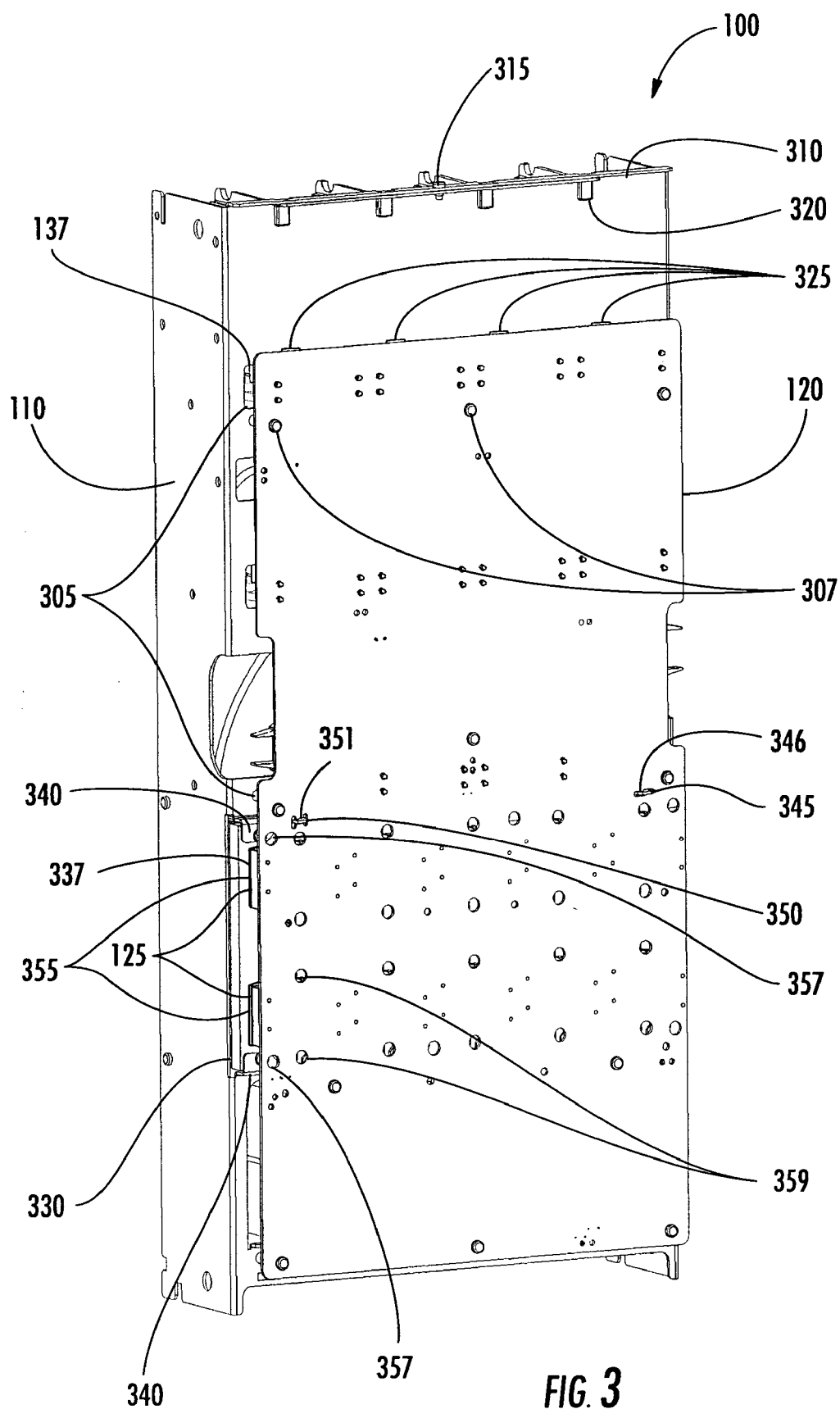
FIG. 3 is a back perspective view of the integrated power module of FIG. 1.

A printed circuit board (PCB) 120 is positioned proximate a back or second side of the mounting member 110. One or more heat generating power circuits 125 (FIG. 3) are electrically coupled to the printed circuit board 120 and positioned between the printed circuit board and the mounting member 110. The heat generating power circuits 125 may be, for example, IGBTs, which may be in a modular form such as in a plastic housing and may be connected in half-bridge or other power switching circuit configurations. The heat generating power circuits 125 may be mounted to the PCB 120, for example, by mounting tabs formed in the plastic housing of the heat generating power circuits 125. Although the heat generating power circuits 125 may use IGBTs, it will be appreciated that the heat generating power circuits 125 may use other devices, such as field-effect transistors (FETs) or silicon controlled rectifiers (SCRs). While the heat generating power circuits 125 shown in the embodiments of FIG. 3 are IGBTs, other configurations are possible, such as replacing an IGBT with multi-transistor modules, for example, a "six-pack" device that replaces six individual IGBTs.

A heat sink 130 is positioned in the cooling passageway 115. The heat sink 130 is thermally coupled to the heat generating power circuits 125.

As shown in the embodiments of FIGS. 1–2, ten inductors 135 are mounted in the cooling passageway 115 in a grid arrangement. Each of the inductors 135 may be mounted on the mounting member 110 and may be directly electrically connected through openings 137 in the mounting member 110 to a power switching circuit on the printed circuit board 120, which power switching circuit may include one or more of the heat generating power circuits 125. The inductors 135 may be connected using inductor connector cables 138 extending from each inductor 135.

A plurality of storage capacitors 139 may also be positioned in the cooling passageway 115 and electrically coupled to the printed circuit board 120. As also shown in FIGS. 1 and 2, a cover plate 143 is positioned on a face of the heat sink 130 opposite the base 330 (FIG. 3) of the heat sink 130. A plurality of bundled power connector cables 141 is shown extending across the plate 143 to bus bars 153 located on an opposite side of the heat sink 130 from the inductors 135. The power connector cables 141 and the inductor connector cables 138 may be directly connected to the printed circuit board 120, rather than being connected through bus bars or the like. The power connector cables 141 are further illustrated as being secured to the plate 141 by connectors 142. Both the power connector cables 141 and the inductor connector cables 138 may extend through openings 137 in the mounting member 110 to access the printed circuit board 120.

Also illustrated in the embodiments of FIG. 1 is a cooling fan assembly 145 including a plurality of cooling fans 147 positioned in a slidable tray 149 that may be opened to allow, for example, access to the fans 147 for repair thereof. The cooling fans may be configured to drive air through the cooling passageway 115 to facilitate cooling of the capacitors 139, heat sink 130 and/or inductors 135. The cooling fans 147 may be configured to blow air up from the bottom of the module 100 past the capacitors 139, the heat sink 130 and the inductors 135. As the heat generating power circuits 125 may be more sensitive to damage from overheating than the inductors 135, it may be beneficial to cool the heat sink 130 with air that has not already been heated by flowing past the inductors 135.

As seen in the embodiments of FIG. 3, the inductors 135 (FIG. 2) may be mounted to the mounting member 110 by inserting a mounting tab 320 of an inductor 135 in a slot 325 of the mounting member 110 extending from the cooling passageway 115. The slot 325 may be a key shaped slot and the mounting tab 320 may be inserted in a wider upper portion and then slid into a narrower lower portion of the slot 325 to position the inductor 135. As seen in FIG. 1, the inductors 135 may extend in rows along the cooling passageway 115 in a grid arrangement. Furthermore, the inductors 135 within a row may be mounted in a contacting stacked relationship along a row. As shown in the embodiments of FIG. 1, the inner two rows include three inductors 135 and the outer two rows include two inductors 135.

Figure 4:
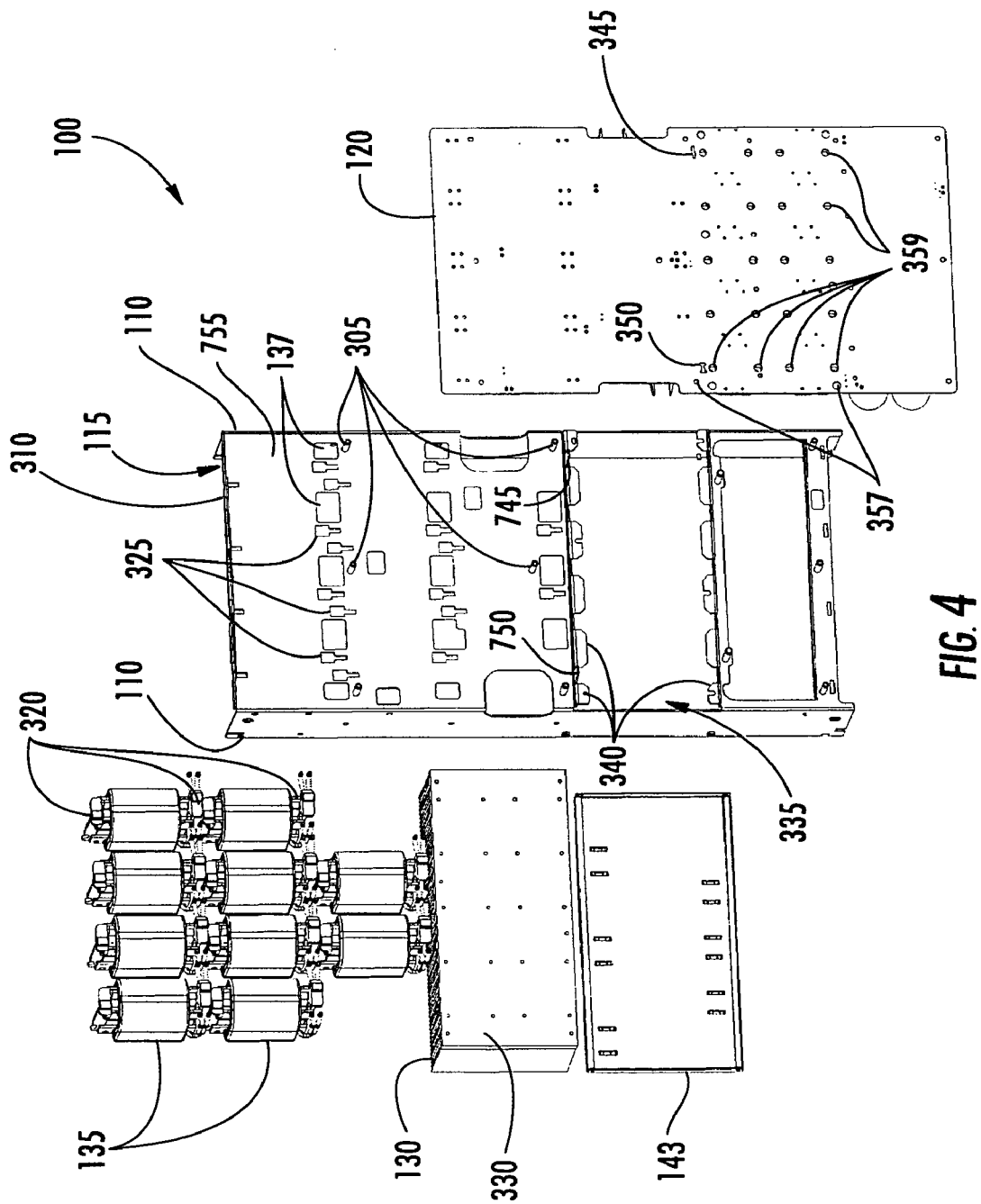
FIG. 4 is an exploded back perspective view of the integrated power module of FIG. 1.

Embodiments of the present invention will now be further described with reference to FIGS. 3 and 4. FIG. 3 is a back perspective view of an integrated power module 100 according to some embodiments of the invention. FIG. 4 is an exploded back perspective view of the module 100 of FIG. 3. As illustrated in FIGS. 3 and 4, the printed circuit board 120 may be mounted on a second or back side of the mounting member 110. As shown in FIG. 3, the printed circuit board 120 is positioned on and attached to mounting posts 305 extending from the back side of the mounting member 110, for example, by mounting screws 307. The mounting posts 305 may act as a locating stop member and have a height selected to provide a desired offset distance between the mounting member 110 and the printed circuit board 120.

As also illustrated in the embodiments of FIGS. 3 and 4, the heat sink 130 includes a base 330 positioned in an opening 335 (see also, FIG. 7) of the mounting member 110. The opening 335 extends from the cooling passageway 115 through to the back side of the mounting member 110 as shown in the embodiments of FIGS. 3 and 4 to allow contact directly to the base 330 of the heat sink 130 from the backside of the mounting member 110. However, it will be understood that, in other embodiments of the present invention, the opening 335 may not be included and a portion of the mounting member 110 may be used to provide thermal coupling between the heat generating power circuits 125 and the heat sink 130. For the embodiments of FIGS. 3 and 4, the mounting member 110 includes a heat sink locating member 340 proximate the opening 335 that locates the base 330 of the heat sink member at a desired distance from the printed circuit board 120.

In some embodiments of the present invention, a thermal pad 355 is positioned between each of the heat generating power circuits 125 and the base 330 of the heat sink 130. More particularly, the heat generating power circuits 125 may be a packaged circuit including a substantially planar heat sink contact surface 337 that is, itself, thermally coupled to heat generating source(s) within the package defining the heat generating power circuit 125. As shown in FIGS. 3 and 4, each of the heat sink contact surfaces 337 is positioned to face the base 330 of the heat sink 130 and be thermally coupled thereto by one of the thermal pads 355. In other embodiments, a common thermal pad associated with the heat sink 130 may be utilized rather than individual thermal pads 355 associated with each of the operational heat generating power circuits 125.

FIGS. 3 and 4 further illustrate securing of the inductors 135 according to some embodiments of the present invention. As discussed previously, the inductors 135 may be mounted in contacting stacked relationship in respective rows extending along the cooling passageway 115. As shown for the embodiments of FIGS. 3 and 4, a bracket 310 may be coupled to the mounting member 110 to secure the stacked inductors 135 to limit movement thereof along a row. For example, a screw 315 may be used to attach the bracket 310 to the mounting member 110 after all of the inductors 135 have been installed.

Also shown in FIGS. 3 and 4 are alignment openings 345, 350 configured to receive tabs extending from the mounting member 110 to align the printed circuit board 120 during attachment thereof to the mounting member 110 to limit movement of the heat sink contact surface 337 relative to the base 330 of the heat sink 130 in a plane defined by the heat sink contact surface 337. By providing proper alignment in the contact surface plane before the thermal pads 355 contact the base 330, a more effective thermal coupling may be provided and damage to the thermal pads 355 may be avoided. However, in other embodiments, such an alignment mechanism need not be provided and other approaches may be taken to assuring suitable thermal coupling. For example, the base 330 of the heat sink 130 may be only loosely positioned in the opening 335 while the printed circuit board 120 is being installed. The base 330 may then be moved into contact with the thermal pads 355 by tightening the connection thereof to the heat sink locating member 340. For such embodiments, access openings 357 may be provided in the printed circuit board 120.

As best seen in FIG. 2, for some embodiments of the present invention, the heat generating power circuit includes a plurality of snap connector arms 365 for attaching the heat generating power circuit 125 to the printed circuit board 120. In addition, the illustrated embodiments of the heat generating power circuit 125 include a pair of mounting arms 367, illustrated as mounting clips, that are used to connect the heat generating power circuit 125 to the base 330 of the heat sink 130. Access openings 359 are provided in the printed circuit board 120 to allow access to the mounting clips 367 for attachment thereof to the base 330 after the printed circuit board 120 is mounted on the mounting member 110.

Figure 5:
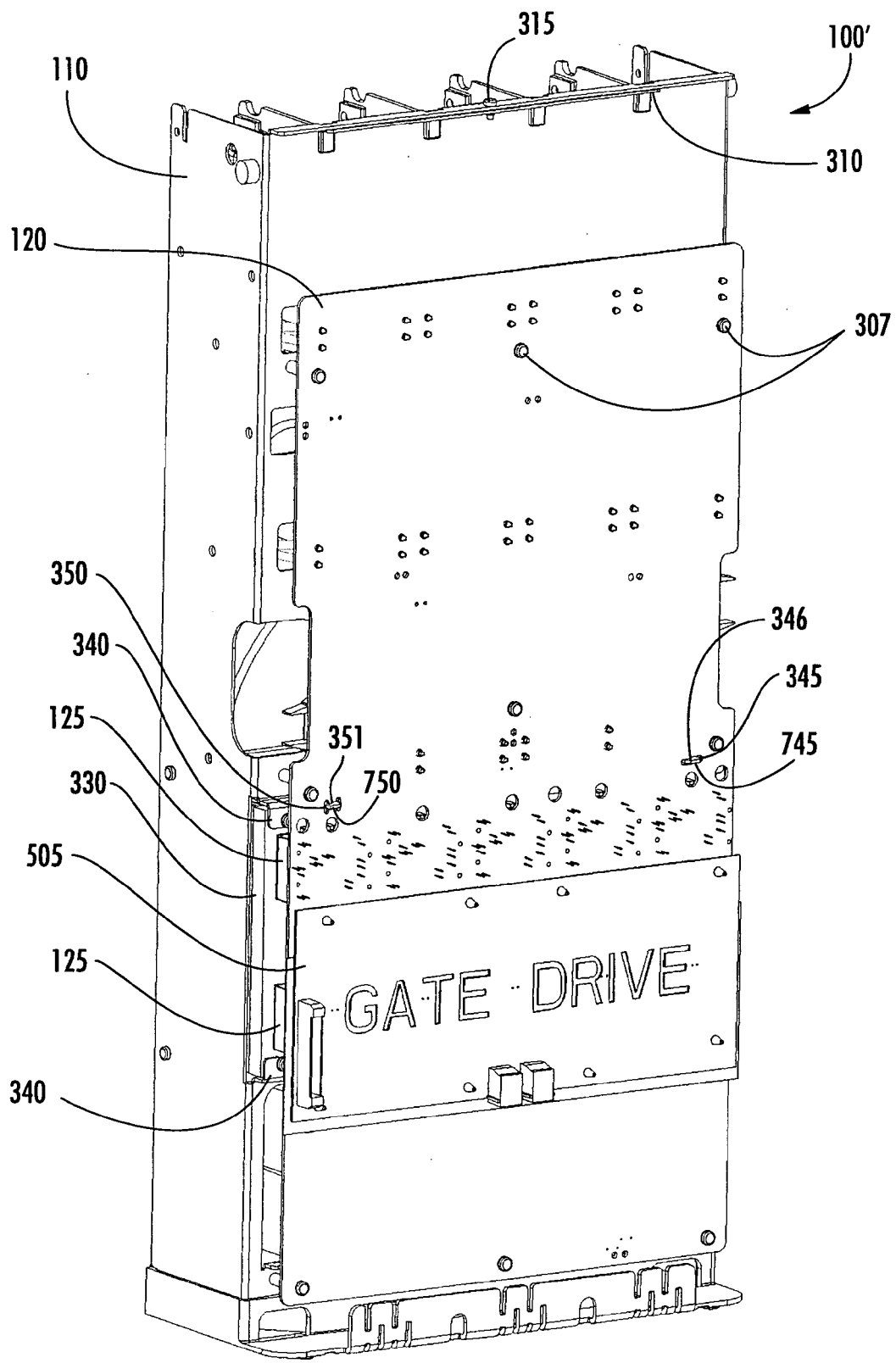
FIG. 5 is a back perspective view of an integrated power module including a gate drive board according to some embodiments of the present invention.

Further embodiments of the present invention are illustrated in the back perspective view of FIG. 5. As shown in FIG. 5, an integrated power module 100' includes a gate drive circuit module 505, shown as a gate drive daughter printed circuit board, that may be attached to the printed circuit board 120. For the particular exemplary configuration illustrated in FIG. 5, the gate drive circuit module 505 is positioned proximate the heat generating power circuits 125.

Figure 6:
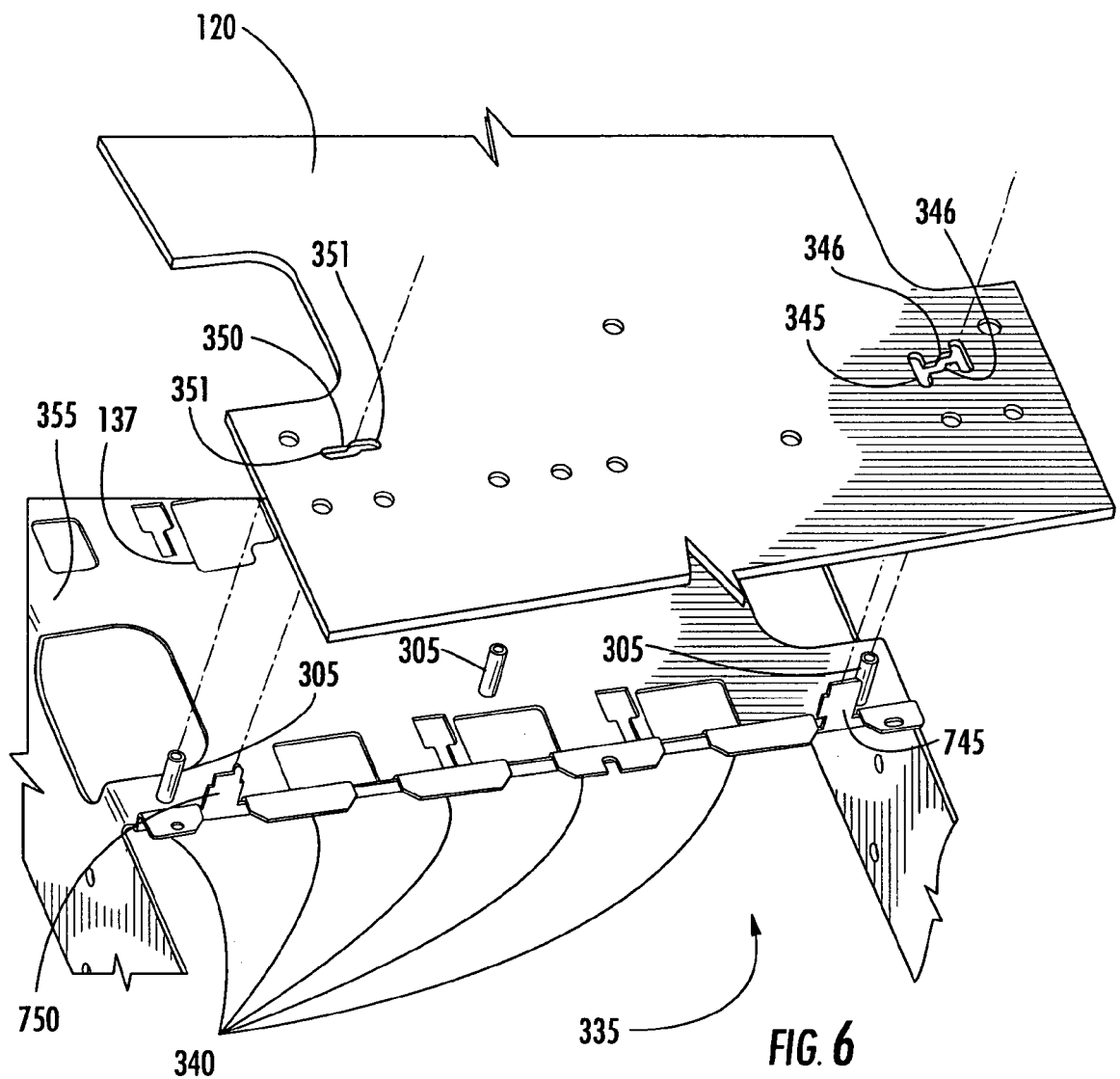
FIG. 6 is a perspective view illustrating positioning of power drive circuit components contacting a cooling region in an integrated power module according to some embodiments of the present invention.
Figure 7:
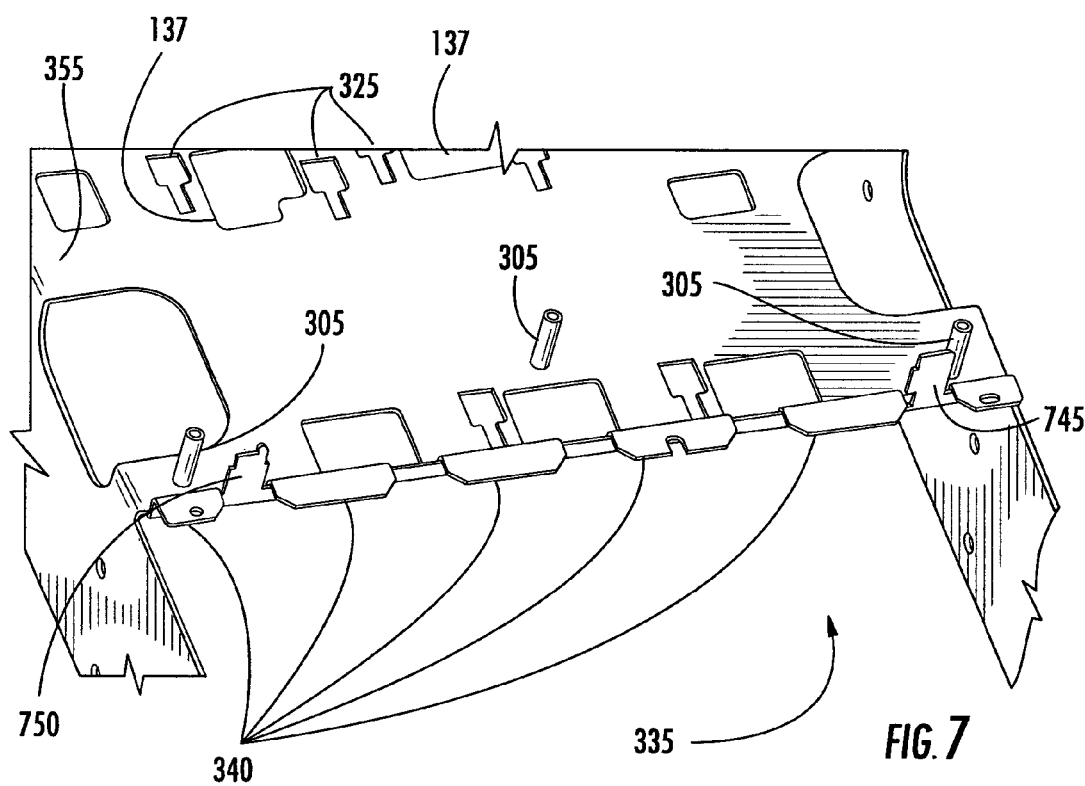
FIG. 7 is a perspective view of the embodiments of FIG. 6 with the printed circuit board removed.

Embodiments of the present invention will now be further described with reference to FIGS. 6 and 7. In particular, thermal coupling of the heat generating power circuits 125 to the heat sink 130 during assembly of the integrated power module 100 will be further described for particular embodiments of the present invention. FIG. 6 illustrates a back perspective view of a portion of a mounting member 110 with a printed circuit board attached. FIG. 7 illustrates the same view without the printed circuit board 120 attached to show further details of the mounting member 110.

As best seen in FIG. 7, the mounting member 110 includes a registration member 745, 750 positioned to contact the printed circuit board 120 during mounting before the printed circuit board 120 contacts the mounting posts 305 or other stop member defining the offset distance of the printed circuit board 120 from the mounting member 110. The registration member 745, 750 is configured to define a position of the heat sink contact surface 337 (FIG. 6) relative to the base 330 of the heat sink 130 (FIG. 3) in a plane defined by the heat sink contact surface 337.

For the particular embodiments illustrated in FIGS. 6 and 7, the registration member includes both a first tab 745 and a second tab 750. The first tab has a height $h_{tab}$ relative to the second side 755 of the mounting member 110 greater than a height $h_{stop}$ of the mounting posts 305 relative to the second side 755 of the mounting member 110. The first tab 745 is positioned on the mounting member 110 to define a reference location along a first axis of the plane defined by the heat sink contact surface 337. The second tab 750 has a height $h_{tab}$ relative to the second side 755 of the mounting member 110 greater than the height $h_{stop}$ of the mounting posts 305. The second tab 750 is positioned on the mounting member 110 to define a reference location along a second axis of the plane defined by the heat sink contact surface.

The first tab 745 and the second tab 750 may have the same height. Furthermore, in other embodiments of the present invention, a single feature may act as the registration member rather than two distinct tabs 745, 750.

As best seen in FIG. 6, the illustrated embodiments of the printed circuit board 120 include a first alignment opening 345 configured to receive and engage the first tab 745. The first alignment opening has a contact surface 346 configured to define the reference location along the first axis of the plane defined by the heat sink contact surface 337. A second alignment opening 350 is configured to receive and engage the second tab 750. The second alignment opening 350 has a contact surface 351 configured to define the reference location along the second axis of the plane defined by the heat sink contact surface 337.

Figure 8A:
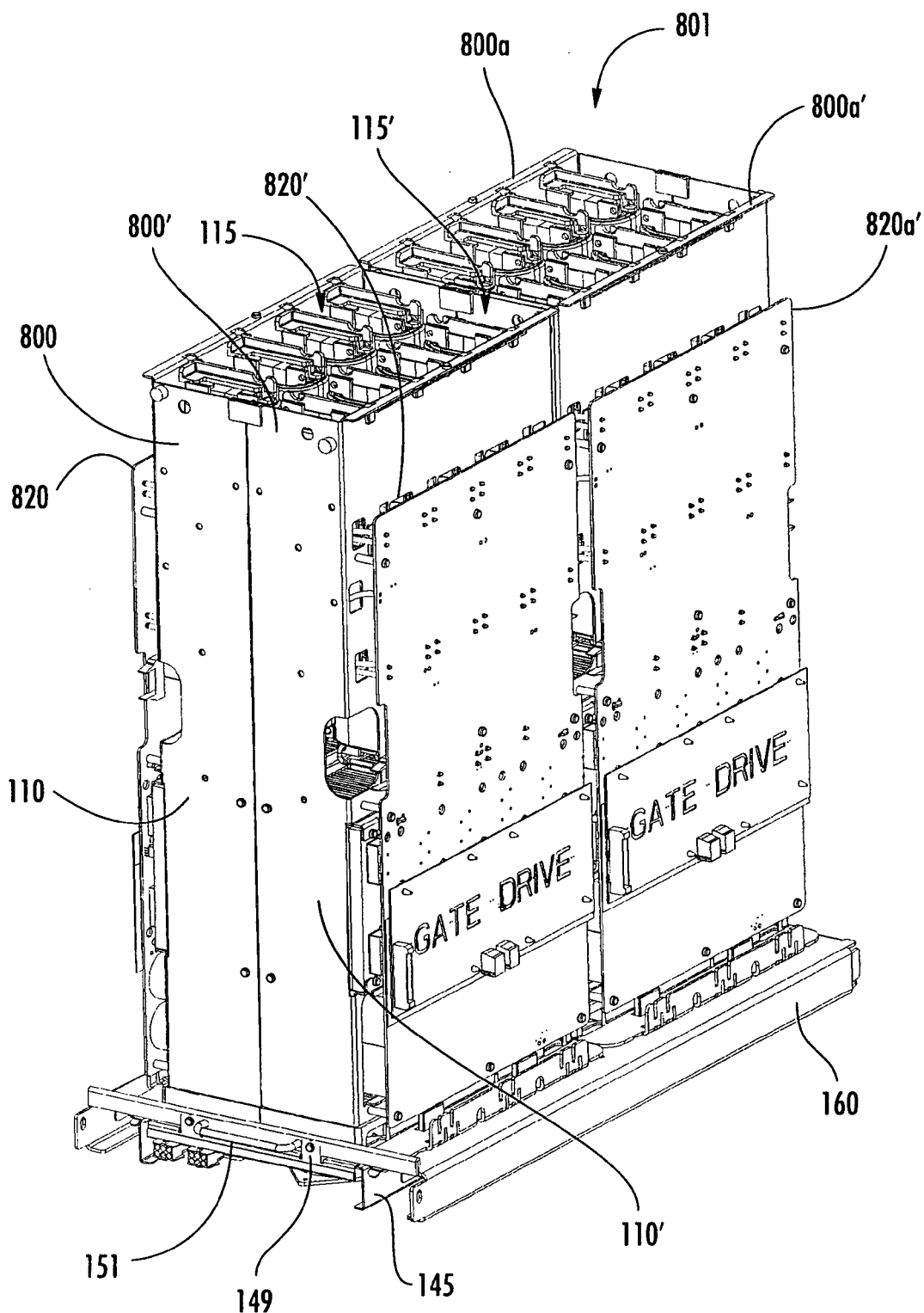
FIG. 8A is a perspective view of an integrated power module assembly including back to back power modules according to some embodiments of the present invention.
Figure 8B:
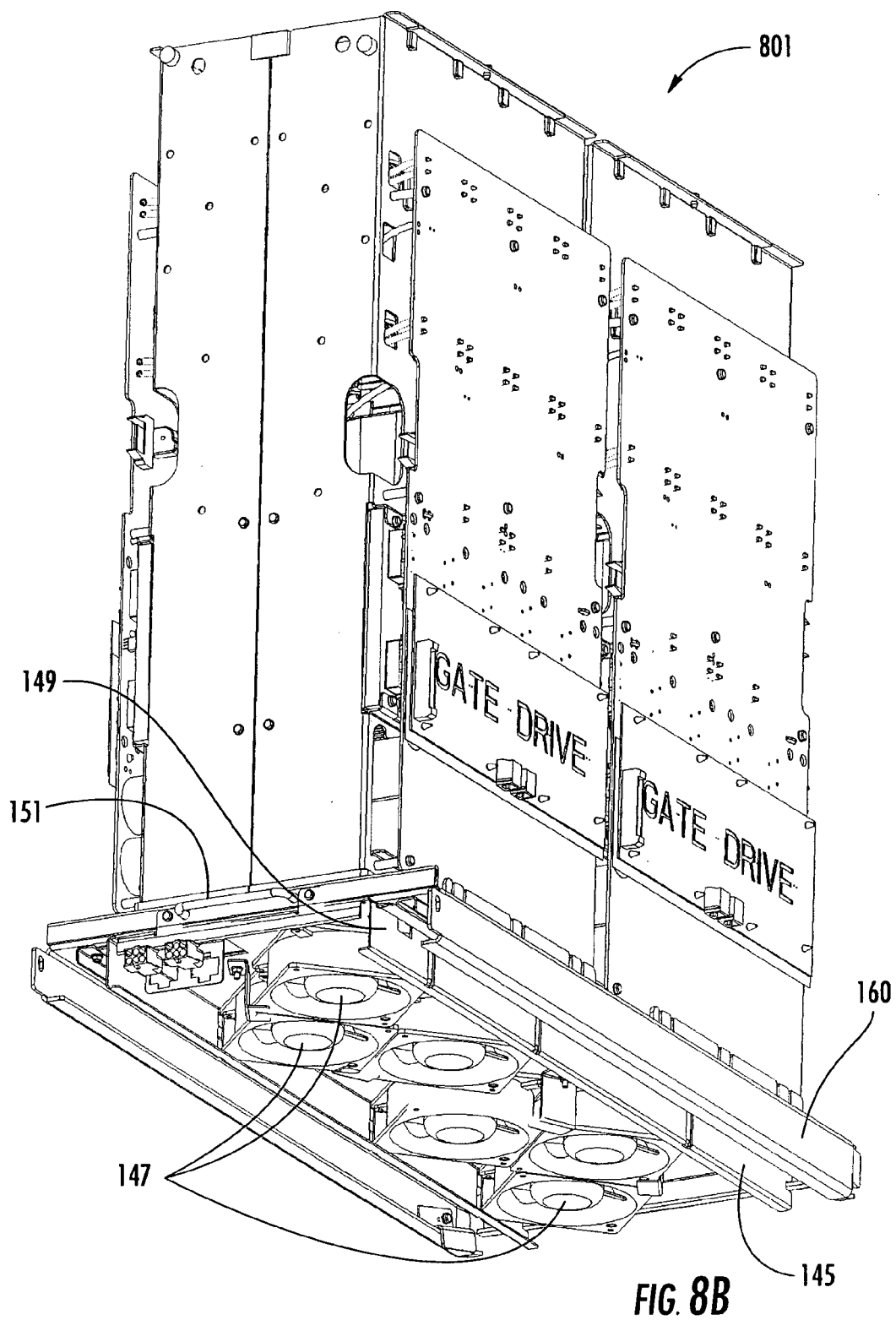
FIG. 8B is a further perspective view of the integrated power module assembly of FIG. 8A.

Further embodiments of the present invention will now be described with reference to FIGS. 8A and 8B. FIGS. 8A and 8B are perspective views of an integrated power module assembly 801, such as a power converter apparatus, including two pairs of back to back power modules 800, 800', 800a, 800a' with the first faces thereof facing each other, according to some embodiments of the present invention. For the embodiments of FIGS. 8A and 8B, the respective cooling passageways 115, 115' are positioned in an adjacent facing relationship to define a combined cooling passageway between the mounting members 110, 110'. The integrated power module assembly 801 may be configured to provide various power conversion functions, including rectifier, inverter and battery converter functions. For example, in an online UPS configuration, two such modules 800, 800' may be used to provide respective rectifier and inverter functions. Additional rectifier or inverter capacity may be obtained by paralleling such combined modules as shown by modules 800a, 800a'. A different circuit board 820, 820', 820a' may be provided depending on the configuration of a particular module. A housing or cabinet (not shown) may be provided to enclose the modules 800, 800' as will be readily understood by those of skill in the art and need not be further described herein. Furthermore, separate fan assemblies or a common fan assembly 145 extending across the combined cooling passageway 115, 115' of each pair may be utilized in the integrated power module assembly 801. As shown in FIGS. 8A and 8B, the fan assembly 145 may include a slidable tray 149 for providing access to cooling fans 147 and a handle 151 may be provided for grasping a power module mounting tray 160.

Figure 9A:
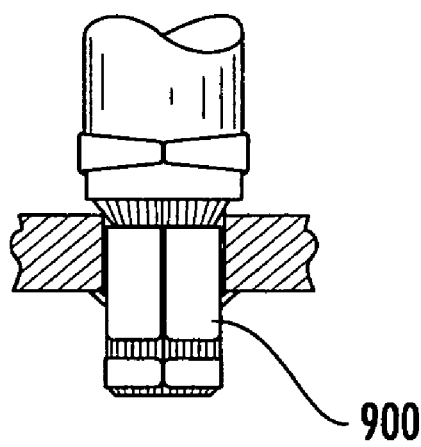
FIG. 9A is a front perspective view of a crimp connector for an integrated power module a according to some embodiments of the present invention.
Figure 9B:
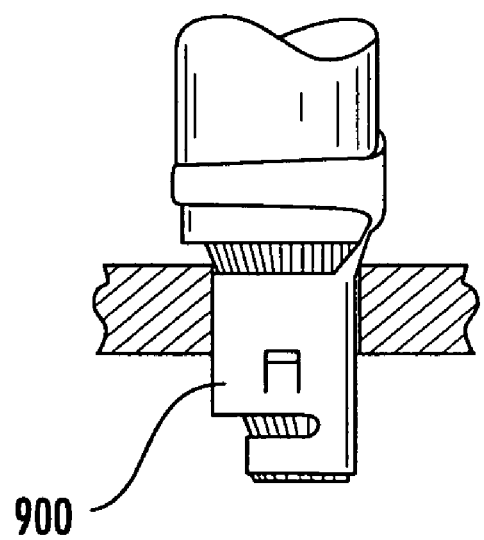
FIG. 9B is a side perspective view of the crimp connector of FIG. 9A.

FIG. 9 illustrates a crimp connector 900 that may be used with the inductor connector cables 138 and/or the power connector cables 141. In particular, the crimp connector 900 may be used to directly connect the inductor connector cables 138 and/or the power connector cables 141 directly to the printed circuit board 120 to be, fore example, wave soldered thereto.

Figure 10:
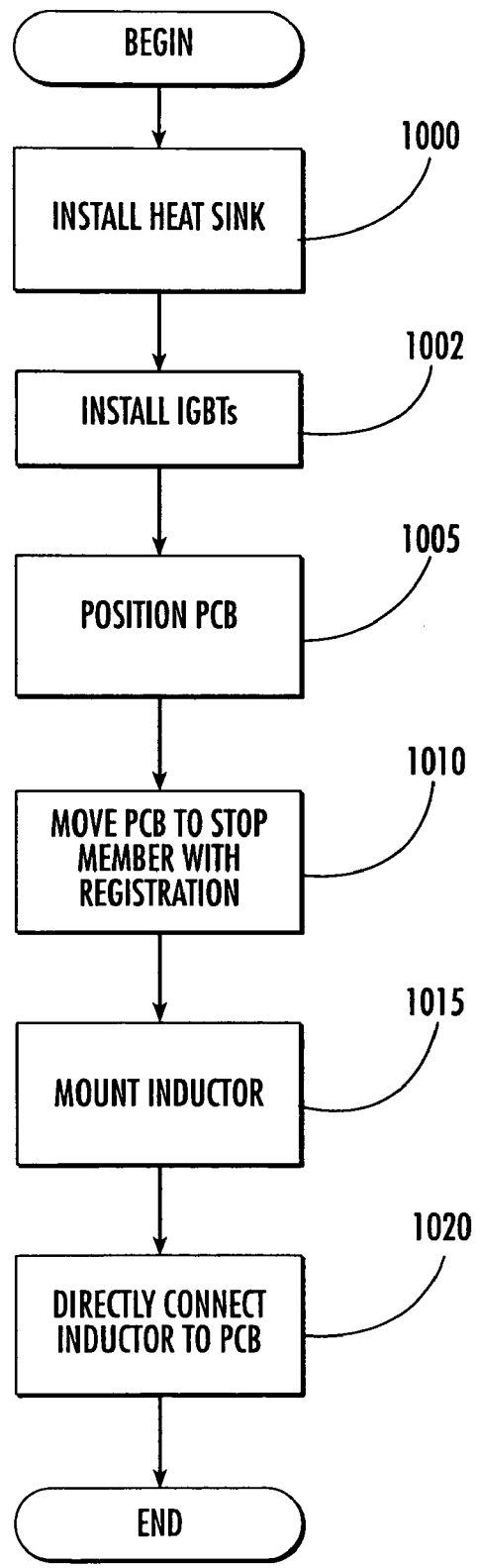
FIG. 10 is a flow chart illustrating forming an integrated power module according to some embodiments of the present invention.

Methods for forming an integrated power module assembly according to some embodiments of the present invention will now be described with reference to the flowchart illustration of FIG. 10. As shown in FIG. 10, operations begin at Block 1000 with installing a heat sink in a cooling passageway on a first side of and defined by a mounting member. A heat generating power circuit, such as an IGBT module, is positioned on a printed circuit board (Block 1002). The heat generating power circuit has a substantially planer heat sink contact surface facing away from the printed circuit board. It will be understood that the printed circuit board may be provided with the IGBT module already positioned therein in various embodiments of the present invention.

The printed circuit board with the heat generating power circuit thereon is positioned with an alignment opening in the printed circuit board adjacent a registration member of the mounting member (Block 1005). The printed circuit board is moved towards the mounting member until the printed circuit board contacts a stop member with the registration member passing into the alignment opening to guide the printed circuit board to a desired position of the heat sink contact surface relative to the heat sink in a plane defined by the heat sink contact surface (Block 1010).

In some embodiments of the present invention, the method further includes mounting one or more inductors on the mounting member in the cooling passageway (Block 1015). The inductors may then be directly connected to the printed circuit board (Block 1020).

Further embodiments of the present invention will now be described with reference to the flow chart illustration of FIG. 11. For the embodiments illustrated in FIG. 11, operations begin at Block 1100 by installing IGBTs with mounting clips on the printed circuit board. It will be understood that the mounting clips may be separate parts that may be attached to the housing of the IGBTs before mounting thereof on the printed circuit board. Such prior installation of the mounting clips may be necessary as the configuration of the IGBT may make it inaccessible once the IGBT is snapped into or otherwise attached to the printed circuit board.

It will be further understood that various preliminary operations may occur prior to the operations described with reference to Block 1100. For example, a variety of discrete components associated with other circuit aspects not included in the IGBT package may be prepared and positioned on the printed circuit board and may be separately coupled to the printed circuit board, for example, by wave soldering, before installation of the IGBTs at Block 1100. These discrete components could also be inspected or any problems with soldering thereof could be touched up and corrected either before or after electrical testing or based on visual inspection. However, it will be understood that a preliminary wave solder before installation and various other steps to be described herein are not necessary for various embodiments of the present invention.

A heat sink is mounted on the mounting members in a cooling passageway thereof (Block 1105). For example, the heat sink could be attached using mounting screws or the like. An initial torque setting for the screws could be used at this point, such as 1.0 Newton-meter (Nm), with a further tightening later in the operation. When using multiple screw type attachment means at different locations for different components of the assembly, it may be beneficial to provide initial attachment at a reduced torque followed by final tightening in a pattern selected to provide a desired securing while limiting distortion of different parts during the assembly process.

Thermal pads are positioned on each of the IGBTs mounted on the printed circuit board (Block 1110). It should be understood however, that in other embodiments of the present invention the thermal pad may, instead, be mounted on the heat sink in the region that will be contacted by the IGBTs. The printed circuit board is then positioned with the component side thereof (i.e., the side including the IGBTs) facing the mounting member and the printed circuit board is aligned with the alignment holes in the printed circuit board adjacent registration tabs on the mounting member (Block 1115). The printed circuit board is moved to a stop position relative to the mounting member with the thermal pads on the IGBT making contact with the heat sink and a printed circuit board contacting feature of the mounting member, such as mounting posts that will be used for attachment of the printed circuit board on the mounting member, acting as a stop member establishing a spacing between the mounting member and the printed circuit board (Block 1120). In other embodiments of the present invention, the IGBT thermal pads are not in contact with the heat sink when the PCB is moved to the stop position. Instead, the corresponding contact region of the heat sink member is tightened in a manner causing engagement with the thermal pads after mounting of the printed circuit board.

In either case, the printed circuit board and the IGBTs, using the mounting clips thereon, are attached, for example, by inserting mounting screws (Block 1125). As discussed above, the attachment using mounting screws may be performed in a desired pattern to a desired torque, such as 2.0 Nm. The mounting of the IGBTs to the printed circuit board may also be inspected to ensure that they are still properly snapped (or otherwise connected) to the printed circuit board.

Power lead wiring may be installed and connected to the printed circuit board (Block 1130). Installation of power lead wiring may require rotation of the power module to allow access to openings in the mounting member to the component side of the printed circuit board. A fixture may be used to secure the solder side of the printed circuit board during such operations. It may also be desirable to maintain the power module in a horizontal orientation for installation operations. Installing the power lead wiring may include installing power lead wiring brackets and tightening of screws securing such brackets as well as directly connecting the power lead wiring into the printed circuit board at designated locations by passing connector cables through openings in the mounting member.

As further shown in FIG. 11, operations may include mounting one or more inductors to the mounting member (Block 1135). The inductors may be secured in the mounting member, for example, by installing a bracket restraining movement of the inductors and connecting the bracket to the mounting member, for example, using a mounting screw tightened to a desired torque such as 2.8 Nm (Block 1140). As with the power lead wiring, inductor connector cables may be directly connected into the printed circuit board at designated locations through openings in the mounting member (Block 1145).

At Block 1150 the module is wave soldered. The power lead harnesses and the like may be routed and bundled before wave soldering to maintain them in a position that will not interfere with the soldering operation. In some embodiments of the present invention requiring additional circuitry, a gate daughter printed circuit board may be added to the assembly (Block 1155).

As described above for various embodiments of integrated power modules according the present invention, an electromechanical assembly may be provided that combines the IGBT and other discrete components and sensors of the device on a printed circuit board with the inductors and/or a gate drive daughter board not mounted on the printed circuit board but included in the single package therewith. The heavy inductors and heat sink may be supported on a mounting frame, such as an aluminum U-shaped chassis, which may also support and align the printed circuit board, for example, using standoffs. The inductor leads may be terminated to the printed circuit board using a direct crimp terminal and may be stacked in line and restrained from movement using a bracket, such as a retaining bar. In addition, the mounting member or chassis may include an alignment/registration feature that works with an alignment hole cut out in the printed circuit board to facilitate alignment of the IGBTs to the heat sink. In addition, the integrated power modules described herein may be grouped in a back to back configuration, for example, to create a rectifier/converter pair that, in combination, create a cooling plenum useful for forced air cooling thereof. The mounting member, such as an aluminum chassis, may also act as an electromagnetic interference (EMI) shield for the magnetic field created by the hybrid conductors and/or other components in the power modules. An aluminum chassis mounting module may be beneficially more "flux tolerant" than a steel chassis to provide lower eddy current loss and reduced heating of the mounting member by eddy currents from the magnetic fields of inductors mounted thereto. Power modules described herein may be particularly beneficial in applications such as three phase uninterruptable power supplies (UPS). The use of traditional interface methods for inductor mounting, such as busbar type and the like, may be reduced or eliminated.

The flowcharts of FIGS. 10 and 11 illustrate the architecture, functionality, and operation of possible implementations of methods for forming an integrated power module assembly according to some embodiments of the present invention. It should be noted that, in some alternative implementations, the acts noted in the blocks may occur out of the order noted in the figures. For example, two blocks shown in succession may, in fact, be executed substantially concurrently, or the blocks may be executed in the reverse order, depending upon the functionality involved.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. An integrated power module, comprising:
a longitudinally extending mounting member defining a cooling passageway on a first side thereof;
a heat sink positioned in the cooling passageway;
a printed circuit board positioned proximate a second side of the mounting member opposite the first side;
a heat generating power circuit electrically coupled to the printed circuit board and positioned between the printed circuit board and the mounting member, the power circuit thermally coupled to the heat sink; and
an inductor mounted in the cooling passageway.

2. The power module of claim 1 wherein the inductor is mounted on the mounting member.

3. The power module-of claim 1 wherein the inductor comprises a plurality of inductors and wherein the heat generating power circuit comprises a plurality of heat generating power circuits.

4. The power module of claim 1 wherein the heat generating power circuit comprises an insulated gate bipolar transistor (IGBT) module and wherein the power module further comprises a power switching circuit, including the IGBT module, on the printed circuit board and wherein the inductor is electrically connected to the power switching circuit.

5. The power module of claim 1 wherein the inductor is directly connected to the printed circuit board.

6. The power module of claim 1 wherein the power module comprises a rectifier or an inverter.

7. The power module of claim 1 further comprising a thermal pad positioned between the heat generating power circuit and the heat sink.

8. The power module of claim 1 wherein the mounting member includes an opening therein extending from the cooling passageway to the second side of the mounting member and wherein the heat sink includes a base positioned in the opening.

9. The power module of claim 8 wherein the mounting member further comprises a heat sink locating member that locates the base of the heat sink at a desired distance from the printed circuit board.

10. The power module of claim 9 wherein the heat generating power circuit includes a substantially planar heat sink contact surface facing the base of the heat sink and wherein the mounting member further comprises:
a stop member defining an offset distance of the printed circuit board from the mounting member; and
a registration member positioned to contact the printed circuit board before the printed circuit board contacts the stop member-during mounting of the printed circuit board, the registration member being configured to define a position of the heat sink contact surface relative to the base of the heat sink in a plane defined by the heat sink contact surface.

11. The power module of claim 10 wherein the printed circuit board is mounted to the mounting member and wherein the mounting member further comprises a plurality of mounting posts extending from the second side of the mounting member.

12. The power module of claim 11 wherein the registration member comprises a first tab having a height relative to the second side of the mounting member greater than a height of the mounting posts relative to the second side of the mounting member, the first tab being positioned on the mounting member to define a reference location along a first axis of the plane defined by the heat sink contact surface and a second tab having a height relative to the second side of the mounting member greater than the height of the mounting posts, the second tab being positioned on the mounting member to define a reference location along a second axis of the plane defined by the heat sink contact surface.

13. The power module of claim 12 wherein the printed circuit board includes a first alignment opening configured to receive and engage the first tab and having a contact surface configured to define the reference location along the first axis of the plane defined by the heat sink contact surface and a second alignment opening configured to receive and engage the second tab and having a contact surface configured to define the reference location along the second axis of the plane defined by the heat sink contact surface.

14. The power module of claim 1 further comprising a mounting arm connecting the heat generating power circuit to the heat sink member.

15. The power module of claim 14 wherein the mounting arm comprises a plurality of mounting clips on the heat generating power circuit.

16. The power module of claim 1 wherein the inductor comprises a plurality of inductors and the heat generating power circuit comprises a plurality of heat generating power circuits and further comprising a plurality of inductor connector cables directly connecting the inductors to the printed circuit board.

17. The power module of claim 16 further comprising a plurality of power connector cables extending to bus bars, wherein the power connector cables are directly connected to the printed circuit board.

18. The power module of claim 17 wherein the heat sink is positioned between the inductors and the bus bars and wherein the plurality of power cables are bundled and extend across the heat sink.

19. The power module of claim 18 wherein the power module further comprises a plate positioned on a face of the heat sink opposite the base of the heat sink and wherein the bundled power cables extend across and are secured to the plate.

20. The power module of claim 16 wherein the mounting member includes a plurality of cable openings therein extending from the cooling passageway towards the printed circuit board and wherein the inductor connector cables pass through the cable openings to directly connect to the printed circuit board.

21. The power module of claim 1 wherein the inductor comprises a plurality of inductors and the heat generating power circuit comprises a plurality of heat generating power circuits and wherein the mounting member further comprises a plurality of slots therein extending from the cooling passageway and wherein the inductors include a mounting tab configured to insert in one of the slots to mount the inductors on the mounting member.

22. The power module of claim 21 wherein the plurality of slots are arranged in a row extending along the cooling passageway and wherein the inductors are mounted in a contacting stacked relationship along the row.

23. The power module of claim 22 further comprising a bracket coupled to the mounting member that secures the stacked inductors to limit movement thereof along the row.

24. The power module of claim 1 wherein the printed circuit board is mounted on the mounting member and wherein the inductor is mounted on the mounting member.

25. A power converter apparatus comprising a housing including therein a pair of the power modules of claim 1 with the first sides thereof facing each other.

26. A method of forming an integrated power module comprising:
   installing a heat sink in a cooling passageway on a first side of and defined by a mounting member;
   providing a heat generating power circuit on a printed circuit board, the heat generating power circuit having a substantially planar heat sink contact surface therein facing way from the printed circuit board;
   positioning the printed circuit board with an alignment opening therein adjacent a registration member of the mounting member; and
   moving the printed circuit board towards the mounting member until the printed circuit board contacts a stop member with the registration member passing into the alignment opening to guide the printer circuit board to a desired position of the heat sink contact surface relative to the heat sink in a plane defined by the heat sink contact surface.

27. The method of claim 26 wherein the mounting member includes a plurality of mounting posts for mounting the printed circuit board and wherein the registration member comprises a first tab and a second tab extending from the mounting member to a height greater than the stop member and wherein positioning the printed circuit board with an alignment opening therein adjacent a registration member of the mounting member comprises positioning a first alignment opening configured to receive and engage the first tab and having a contact surface configured to define a reference location along a first axis of the plane defined by the heat sink contact surface sink and a second alignment opening configured to receive and engage the second tab and having a contact surface configured to define a reference location along a second axis of the plane defined by the heat sink contact surface.

28. The method of claim 26 further comprising:
   mounting an inductor on the mounting member in the cooling passageway; and
   directly connecting the inductor to the printed circuit board.

* * * * *

UNITED STATES PATENT AND TRADEMARK OFFICE
CERTIFICATE OF CORRECTION

PATENT NO. : 7,113,405 B2  
APPLICATION NO. : 10/855869  
DATED : September 26, 2006  
INVENTOR(S) : Armstrong et al.

Page 1 of 1

It is certified that error appears in the above-identified patent and that said Letters Patent is hereby corrected as shown below:

Column 11,  
Line 64 should read -- 3. The power module of claim 1 wherein the inductor --

Column 12,  
Line 33 should read -- the stop member during mounting of the printed circuit --

Signed and Sealed this

Twenty-seventh Day of March, 2007

JON W. DUDAS  
*Director of the United States Patent and Trademark Office*